(12) United States Patent
Schuster

(10) Patent No.: US 8,049,973 B2
(45) Date of Patent: *Nov. 1, 2011

(54) PROJECTION OBJECTIVE AND METHOD FOR OPTIMIZING A SYSTEM APERTURE STOP OF A PROJECTION OBJECTIVE

(75) Inventor: Karl-Heinz Schuster, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 45 days.

This patent is subject to a terminal disclaimer.

(21) Appl. No.: 12/776,047

(22) Filed: May 7, 2010

(65) Prior Publication Data
US 2010/0214551 A1    Aug. 26, 2010

Related U.S. Application Data

(63) Continuation of application No. 12/032,010, filed on Feb. 15, 2008, now Pat. No. 7,751,127, which is a continuation of application No. PCT/EP2006/007904, filed on Aug. 10, 2006.

(60) Provisional application No. 60/709,177, filed on Aug. 17, 2005.

(51) Int. Cl.
*G02B 9/00* (2006.01)
*G02B 3/00* (2006.01)

(52) U.S. Cl. ........................................ 359/739; 359/649

(58) Field of Classification Search .......... 359/649–651, 359/738–740
See application file for complete search history.

(56) References Cited

U.S. PATENT DOCUMENTS

| 5,384,654 | A | 1/1995 | Iba |
| 6,084,655 | A | 7/2000 | Suzuki et al. |
| 6,144,495 | A | 11/2000 | Koch et al. |
| 6,324,016 | B1 | 11/2001 | Luster |
| 6,445,510 | B1 | 9/2002 | Schuster et al. |
| 7,623,620 | B2 | 11/2009 | Mann et al. |
| 7,751,127 | B2 * | 7/2010 | Schuster ........... 359/739 |
| 2001/0003480 | A1 | 6/2001 | Ryuk et al. |
| 2003/0007253 | A1 | 1/2003 | Schuster et al. |
| 2005/0264787 | A1 | 12/2005 | Mann et al. |
| 2006/0012885 | A1 | 1/2006 | Beder et al. |
| 2006/0198029 | A1 | 9/2006 | Schuster |

FOREIGN PATENT DOCUMENTS

| DE | 199 55 984 | 5/2001 |
| EP | 0 964 282 A2 | 12/1999 |
| EP | 1 118 910 A2 | 7/2001 |
| EP | 1 139 173 A2 | 10/2001 |
| WO | WO 03/077036 | 9/2003 |

OTHER PUBLICATIONS

U.S. Appl. No. 61/219,823, filed Jun. 24, 2009.

* cited by examiner

*Primary Examiner* — Scott J Sugarman
(74) *Attorney, Agent, or Firm* — Fish & Richardson P.C.

(57) ABSTRACT

In certain aspects, the disclosure relates to a projection objective, in particular for a microlithography exposure apparatus, serving to project an image of an object field in an object plane onto an image field in an image plane. The projection objective includes a system aperture stop and refractive and/or reflective optical elements that are arranged relative to an optical system axis. The centroid of the image field is arranged at a lateral distance from the optical system axis). The system aperture stop has an inner aperture stop border which encloses an aperture stop opening and whose shape is defined by a border contour curve. The border contour curve runs at least in part outside of a plane that spreads orthogonally to the optical system axis.

11 Claims, 7 Drawing Sheets

PROJECTION OBJECTIVE AND METHOD FOR OPTIMIZING A SYSTEM APERTURE STOP OF A PROJECTION OBJECTIVE

CROSS-REFERENCE TO RELATED APPLICATIONS

This application is a continuation application of and claims priority to U.S. application Ser. No. 12/032,010, filed on Feb. 15, 2008, which is a continuation of PCT/EP2006/007904, filed Aug. 10, 2006, which claims benefit of U.S. Provisional Patent Application No. 60/709,177, filed on Aug. 17, 2005. The entire contents of the above-referenced applications are incorporated herein by reference.

FIELD

The disclosure relates to a projection objective, specifically for a microlithography exposure apparatus. In addition, the disclosure relates to an illumination system, a microlithography exposure apparatus, and a method of optimizing a system aperture stop of a projection objective.

DISCLOSURE

Projection objectives are used for example in the manufacture of electronic circuit elements or other microstructured components. In the process of manufacturing such elements, the projection objective serves to project an image of a template which is also referred to as a mask or reticle, onto a substrate which carries a light-sensitive coating.

The trend to ever higher packing densities in electronic circuit elements and the miniaturization which also continues in other areas have the consequence that the structures which are being manufactured are getting smaller and smaller. Accordingly, more stringent requirements are imposed on the projection objective used for this process, with the interest being centered in particular on the achievable resolution. A high resolution can be attained in particular through a high numerical aperture value of the projection objective. However, with a numerical aperture value larger than 1, it becomes increasingly difficult to keep the telecentricity error as small as possible, i.e. to achieve that the light bundles in the object plane and in the image plane are oriented, respectively, as much as possible perpendicular to the object plane and to the image plane. The telecentricity error indicates the angle by which the orientations of the light bundles in the object plane and in the image plane deviate from the respective normal directions of these planes. By limiting the telecentricity errors on the image side to small values, one ensures that the conditions for the image formation are nearly identical for any image point within the image field and that under small focus variations the lateral image position is preserved. Especially with high numerical aperture values, it is important to keep the image-side telecentricity error small in order to ensure an undisturbed image formation in regard to interference contrast and lateral image position. However, with increasing numerical aperture on the image side it gets progressively more difficult to limit the image-side telecentricity error to low values. A purely refractive projection objective with a small telecentricity error has been disclosed in WO 2003/077036.

An image-projecting device, in particular an objective with a system aperture stop, whose aperture diameter is adjustable is disclosed in DE 199 55 984 A1. The system aperture stop is configured so that its position varies, dependent on the aperture diameter, with an axial position change being the preferred direction of movement. A sideways movement or a tilting movement or any combination of the movements is conceivable in accordance with the disclosure of DE 199 55 984 A1.

SUMMARY

Disclosed embodiments include projection objectives having the best possible imaging properties, specifically with the smallest possible telecentricity error.

In certain aspects, projection objectives for projecting an image of an object field in an object plane onto an image field in an image plane are envisioned specifically for a microlithography exposure apparatus. In some embodiments, the projection objective has a system aperture stop and refractive and/or reflective optical elements which are arranged relative to an optical system axis. The centroid (also referred to as area center of gravity) of the image field is arranged at a lateral distance from the optical system axis. The system aperture stop has an inner aperture stop border which encloses an aperture stop opening and whose shape is defined by a border contour curve. The border contour curve runs at least in some sections outside of a plane that spreads out orthogonally to the optical system axis. It is also possible that the projection of the border contour curve into a plane that extends orthogonal to the optical system axis is off-centered from the optical system axis. The contour curve can further be configured as an irregular polygon in which at least one corner deviates from a circular line which envelops the polygon on the outside.

In some embodiments, the projection objective has a small telecentricity error on the image side and/or on the object side. This can be achieved with comparatively small adaptations through the configuration of the system aperture stop. This configuration of the system aperture stop can obviate the need for other corrective measures for getting rid of the telecentricity error, such as for example additional lenses or strongly deformed aspheres.

A condition of telecentricity on the image side, i.e. a telecentricity error of zero on the image side, is present if the principal rays within the image field are oriented perpendicular to the image plane. A condition of telecentricity on the object side, i.e. a telecentricity error of zero on the object side, is present if the principal rays within the object field are oriented perpendicular to the object plane. If the image plane or the object plane is oriented orthogonal to the optical system axis, a telecentric condition exists if the principal rays in the area under consideration run parallel to the optical system axis. A principal ray is in either case defined as originating from an off-axis point of the object field and passing through the center of the system aperture stop.

Keeping the telecentricity error on the image side small makes it possible even with a high numerical aperture value to achieve a largely undisturbed image formation in regard to interference contrast and image position. Furthermore, keeping the telecentricity error on the image side small is of particular importance if the projection objective has one or more optical elements in the form of uniaxial crystals with pronounced intrinsic birefringence, or in the form of so-called isotropic crystals such as for example $MgAl_2O_4$, $Y_3Al_5O_{12}$ or MgO. If the telecentricity error is small, it is possible with the uniaxial crystals to make use of the refractive index for the ordinary ray with tangential polarization. This applies analogously to the isotropic crystals which exhibit intrinsic birefringence at the operating wavelength of the projection objective.

The sides of the irregular polygon which in an embodiment of the projection objective constitutes the border contour of the system aperture stop can be configured as curved line segments. Thus, a multitude of border contours can be represented through approximation. The sides of the polygon are in particular configured with different shapes. It is for example possible by way of the polygon to emulate an ellipse or a nonlinear stretched ellipse.

The border contour of the system aperture stop can be configured as a planar curve. The curve in the present context is still considered planar even if the aperture stop, due to the way it is constructed, has several segments which are slightly offset against each other in the area of the inner aperture stop border, so that the segments of the border contour of the system aperture stop are not lying in the same plane in the exact sense of the word.

The system aperture stop can be coupled to a sliding- or tilting mechanism. This creates in particular the possibility, when changing the size of the opening of the aperture stop, to also change its position and/or orientation, again for the purpose of attaining the smallest possible telecentricity errors with different numerical apertures.

The system aperture stop can be realized by using several aperture stops arranged beside each other. With the plurality of aperture stops it is possible in particular to emulate a sideways movement of the system aperture stop and/or a shape of the border contour curve of the system aperture stop that lies at least in part outside of a plane which spreads out orthogonally to the optical system axis. This has the advantage that the sliding mechanism can be dispensed with or that the system aperture stop does not need to be mounted at an inclined angle relative to the plane that extends orthogonal to the optical system axis.

In some embodiments, a large number of the optical element axes of the refractive and/or reflective optical elements are arranged on the optical system axis. In particular, it is also possible that all such optical element axes are arranged on the optical system axis. In this case, too, telecentricity errors can surprisingly be reduced by deviating from a circular aperture stop that is centered with the optical system axis.

The projection objective can be designed for an operating wavelength below 250 nm, such as below 200 nm. The projection objective can further be designed for an operating wavelength above 100 nm. The numerical aperture of the projection objective on the image side can have a value of at least 0.9, such as at least 1.25, such as at least 1.4.

In certain embodiments, the projection objective is of a catadioptric design and thus includes one or more lenses as well as one or more mirrors. The projection objective includes in particular at least one concave mirror. In a first lens group which is adjacent to the object plane and has three lenses, there can be at least one lens with an aspherical lens surface of at least fifth-order asphericity.

The last optical element on the image side of the projection objective can be formed from a material with intrinsic birefringence. The last optical element on the image side can in particular consist of sapphire.

The disclosure further relates to an illumination system for a microlithography exposure apparatus. The illumination system has an aperture stop with an inner border contour which encloses an aperture stop opening and whose shape is defined by a border contour curve. The contour curve is off-centered relative to an optical system axis and/or lies at least in part outside of a plane that spreads orthogonally to the optical system axis.

In certain embodiments, a microlithography projection exposure apparatus includes an illumination system and/or a projection objective designed according to the foregoing description. The object field of the projection objective can be not telecentrically illuminated by the illumination system. This allows the illumination to be adapted to the telecentricity errors on the object side of the projection objective which can occur in particular when the projection objective is optimized in regard to the telecentricity errors on the image side.

The disclosure further relates to a method of operating a projection objective of the forgoing description, wherein when the aperture of the projection objective is changed, the system aperture stop is also changed in regard to the shape of its border contour curve and/or in regard to its position and/or its orientation relative to the optical system axis. This makes it possible to always operate the projection objective in a condition of low telecentricity errors, even if the aperture is changed.

The disclosure also relates to a method of optimizing a system aperture stop of a projection objective, in particular for a microlithography exposure apparatus. Under this method, a first coma ray and a second coma ray are calculated for a desired aperture of the projection objective for each of at least two image field heights of an image field whose centroid is arranged at a lateral distance from an optical system axis of the projection objective. The coma rays are distinguished by the fact that they are at the limit of still passing the desired aperture. The system aperture stop is configured and/or arranged so that a border contour curve for an inner aperture stop border which encloses an aperture stop opening runs through the points of intersection of the first coma rays and the points of intersection of the second coma rays.

This makes it possible to find a favorable configuration of the system aperture stop with a comparatively modest application of resources.

In some embodiments, the points of intersection of the coma rays define the position of a planar border contour curve, or the border contour curve defined by the points of intersection of the coma rays is projected into a plane.

In particular, the coma rays are calculated in each case under conditions of telecentricity on the image side. The coma rays can be calculated for an image field height which is at most 20% larger, such as at most 10% larger than a minimum image field height. Furthermore, the coma rays can be calculated for an image field height which is at most 20% smaller, such as at most 10% smaller than a maximum image field height.

As a part of the method one might envision to optimize the design of the projection objective for a specific object field height prior to the calculation of the coma rays. After the calculation of the coma rays, the design of the projection objective can be optimized anew for the border contour of the system aperture stop that was determined. In particular, the determination of the border contour curve of the system aperture stop by using the coma rays and the optimization of the design of the projection objective for the border contour that was determined are carried out in iterative cycles until a previously specified requirement for the projection objective has been satisfied.

BRIEF DESCRIPTION OF THE DRAWINGS

Aspects of the disclosure will hereinafter be explained in more detail through the examples of embodiments that are illustrated in the drawings, wherein.

DETAILED DESCRIPTION

Figure 1:
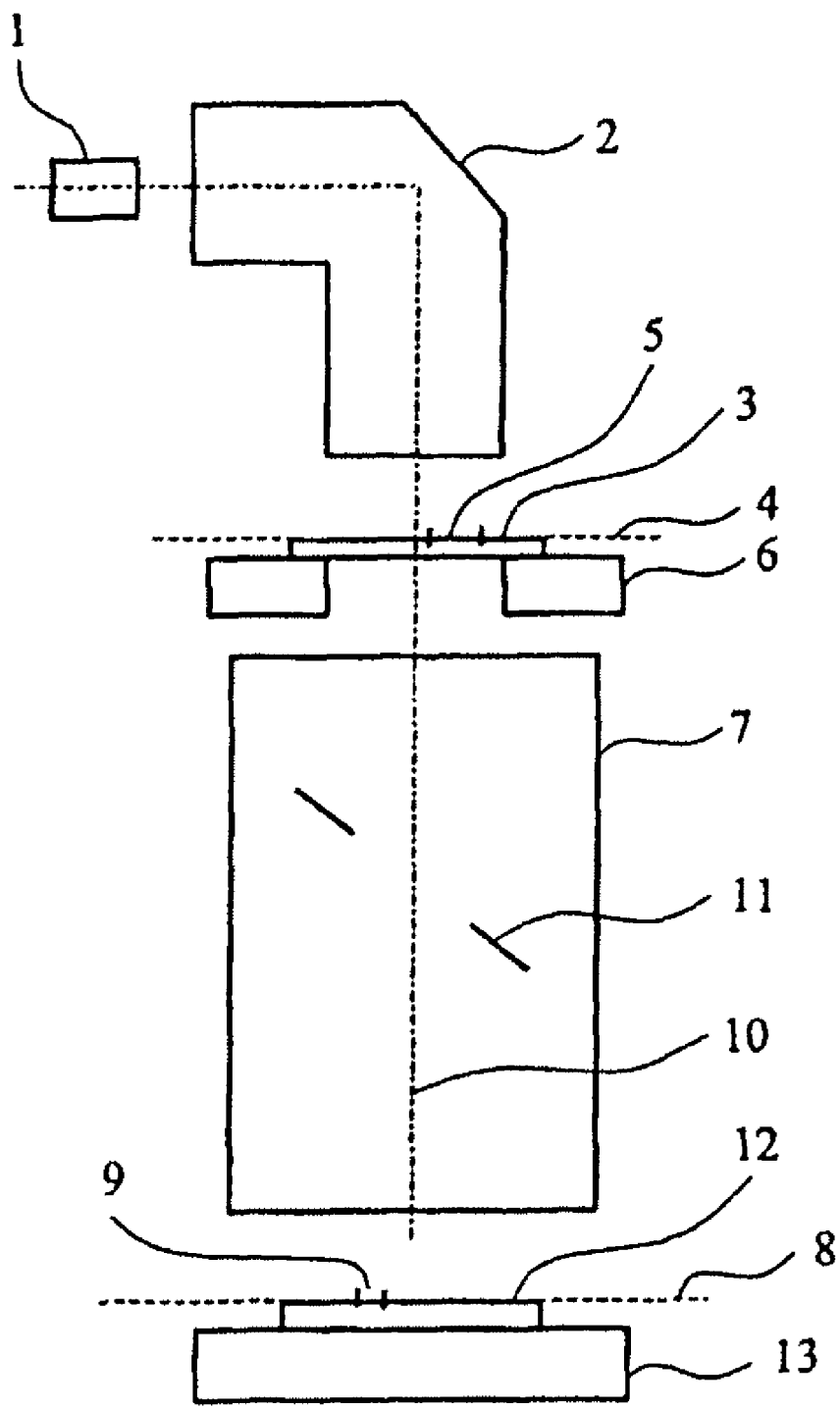
FIG. 1 shows an embodiment of a microlithography exposure apparatus in a strongly simplified building-block representation.

FIG. 1 shows a strongly simplified building-block representation of an example of a microlithography exposure apparatus. A microlithography exposure apparatus of this type can be used for example in the manufacture of highly integrated semiconductor components.

The microlithography exposure apparatus includes a light source 1 which generates light of a wavelength that lies, in general, in the UV range or in the range of soft X-rays. The light source 1 can for example be an ArF excimer laser which emits light with a wavelength of 193 nm. However, other types of light sources 1 can also be used, such as for example an $F_2$ excimer laser with a wavelength of about 157 nm, a KrF excimer laser with a wavelength of 248 nm, etc. What light source to use depends on the operating wavelength for which the microlithography exposure apparatus is designed. The microlithography exposure apparatus under consideration here can be designed for an operating wavelength larger than 100 nm and smaller than 250 nm, in particular smaller than 200 nm.

The light generated by the light source 1 is directed to an illumination system 2. The illumination system 2 serves to produce the best possible illumination for a reticle 3, also referred to as a mask and arranged in an object plane 4, which follows in the light path after the illumination system 2. The illumination system 2 illuminates an area in the object plane 4 which in the following is referred to as the object field 5 and is in particular of rectangular shape. If the microlithography exposure apparatus is being operated for example in a scanning mode, the illuminated area can by defined by a scanner slot which is not shown in FIG. 1. Depending on the requirements that have to be met, the illumination system 2 can include devices for selecting an illumination mode and in particular for setting a desired state of polarization of the illumination light.

The reticle 3 is attached to a reticle holder 6 which is also referred to as reticle stage and which allows for example a lateral movement of the reticle 3 during a scanning process. An image of the structures formed on the reticle 3 is projected by using a projection objective 7 which is arranged immediately downstream of the reticle 3 onto an image field 9 in an image plane 8 which follows after the projection objective 7. Analogous to the object field, the image field 9 can also be of rectangular shape. However, the dimensions of the image field 9 are normally smaller than the dimensions of the object field 5, as the projection objective is generally designed so that it produces a reduced image.

The projection objective 7 extends along an optical system axis 10 which is defined by a large number of optical elements (not individually shown in FIG. 1 for the sake of clarity), each of the elements having an optical element axis. All of the optical element axes or at least a large part of the optical element axes coincide with the optical system axis 10. The centroid of the object field 5 and also the centroid of the image field 9 can lie not on the optical system axis 10, but can be each arranged at a lateral distance from the optical system axis 10.

The projection objective 7 has a system aperture stop 11 which is shown symbolically in FIG. 1. The arrangement, orientation and configuration of the system aperture stop 11 will be described in more detail hereinafter.

In the image plane 8, a substrate 12 is arranged on a substrate holder 13. The substrate holder 13, also referred to as wafer stage, allows a multitude of possible movements and adjustments.

By means to the substrate holder 13, the substrate 12 can for example be moved laterally, i.e. at a right angle to the optical system axis 10. The movement of the substrate holder 13 envisioned for a scanning mode of the microlithography exposure apparatus is in particular synchronous and antiparallel to the movement of the reticle 3. The substrate holder 13 further allows a movement of the substrate 12 parallel to the optical system axis as well as a tilting movement about at least one tilt axis. This makes it possible to position the surface of the substrate 12, more specifically a light-sensitive coating on the surface of the substrate, exactly in the image plane 8 of the projection objective 7. The substrate 12 is for example a wafer, in particular a silicon wafer.

Between the end of the projection objective 7 on the image side and the substrate 12, there can be an immersion liquid (not shown in FIG. 1) for the purpose of allowing the projection objective 7 to be operated with an image-side numerical aperture NA larger than 1. The immersion liquid is in wetting contact with the last optical element on the image side of the projection objective 7 and with the substrate 12. It is likewise possible to use a solid immersion medium which is in direct contact with the last optical element of the projection objective 7 and has a very small distance from the substrate 12.

Figure 2:
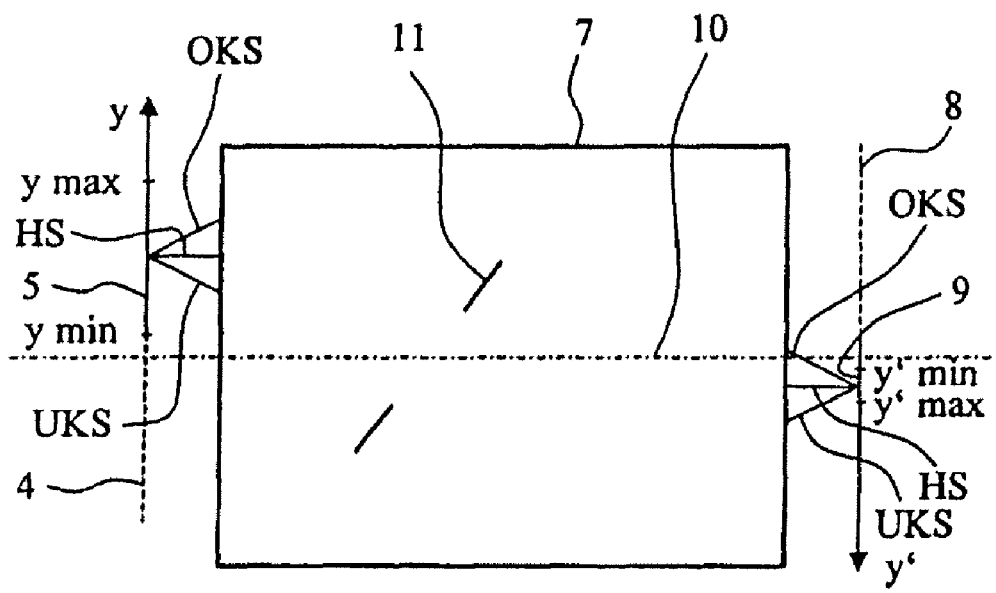
FIG. 2 shows a strongly simplified schematic view of the image-projection geometry of the projection objective, FIG. 3 schematically illustrates the geometry of the image field.

FIG. 2 shows a strongly simplified representation of the image-projection geometry of the projection objective 7. The object plane 4 as shown in FIG. 2 coincides with a y-coordinate axis which runs parallel to the shorter side of the rectangular object field 5. The latter extends between the coordinates $y_{min}$ and $y_{max}$. In the image plane 8, a y'-coordinate axis is shown which runs parallel to the shorter side of the rectangular image field 9, the latter extending between the coordinates $y'_{min}$ and $y'_{max}$.

The image quality of the projection objective 7 depends among other factors on the telecentricity, in particular the telecentricity on the image side. Telecentricity on the image side exists if the principal rays within the image field 9 are oriented orthogonal to the image plane 8. If this condition is met only in a partial area of the image field 9, then only this partial area exhibits telecentricity. The image plane 8 is normally oriented orthogonally to the optical system axis 10, in which case the foregoing definition of telecentricity is equivalent to the customary definition according to which the principal rays in the area under consideration run parallel to the optical system axis 10. A principal ray as understood in this context is defined so that it originates from an off-axis point of the object field 5 and passes through the middle of the system aperture stop 11. FIG. 2 shows as an example a principal ray HS which is telecentric in both the object plane 4 and the image plane 8. The path of the ray through the projection objective 7 is not shown in the drawing. Also represented in FIG. 2 and shown both in the area of the object plane 4 and again in the area of the image plane 8 are a lower coma ray UKS and an upper coma ray OKS which originate from an off-axis object point and just pass the system aperture stop 11. The upper coma ray OKS is directed at an upward angle and just passes the system aperture stop 11 at its upper border. The coma rays are in some instances also referred to as marginal rays. In the following, the term "marginal rays" will be used only for rays which originated from an object point on the optical system axis 10 and just pass by the border of the system aperture stop 11. For such rays originating from off-axis object points, the term "coma ray" will be used.

Analogous to the telecentricity on the image side, a condition of telecentricity on the object side exists if the principal rays HS within the object field 5 are oriented perpendicular to the object plane 4, i.e. parallel to the optical system axis 10.

The angle by which the actual orientation of a principal ray deviates from a telecentric principal ray is referred to as telecentricity error. As long as telecentricity errors are small, there is no appreciable deterioration in the image quality. In particular with the telecentricity errors on the image side being small, there is assurance that the imaging conditions are nearly identical for any image point within the image plane 8. It is in this case irrelevant whether the image point lies on the optical system axis 10, in the center of the image field 9 or at the border of the image field 9. In particular the lateral image position remains preserved with small focus variations.

If the light bundles which contribute to the projection of the image of the reticle 3 onto the substrate 12 do not have a rotationally symmetric energy distribution, it is advantageous to define the telecentricity and the telecentricity errors through the center-of-gravity rays. The center-of-gravity rays in this case indicate the respective energy-weighted centers of the light bundles that contribute to the formation of the image, and in the definition of the telecentricity or of the telecentricity errors the center-of-gravity rays take the place of the principal rays.

Figure 3:
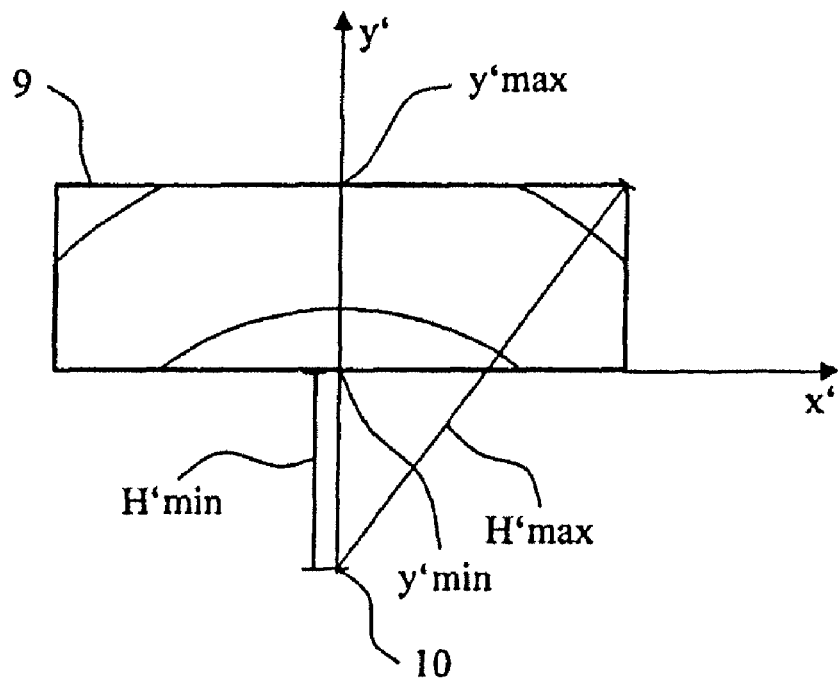

FIG. 3 illustrates the geometry of the image field 9 in a schematic representation. The coordinate axes are represented as an x'-axis running parallel to the longer side of the rectangular image field 9, and a y'-axis running parallel to the shorter side of the rectangular image field 9. Specifically indicated in FIG. 3 are a few values for the image field height H' which represents the respective distance of an image point from the optical system axis 10. This distance is defined as the respective perpendicular distance of a field point from the optical system axis 10. Of special interest are the minimum image field height $H'_{min}$ and the maximum image field height $H'_{max}$. In analogous manner, the object field height H as well as the minimum object field height $H'_{min}$ and the maximum object field height $H_{max}$ are defined in the object plane 4.

The circular arcs drawn as examples in FIG. 3 represent location ranges of equal image field height H'. Within each of these ranges the telecentricity error remains constant. The projection objective 7 can for example be designed in such a way that the circular arc with a radius slightly larger than the minimum image field height $H'_{min}$ and the circular arcs with a radius slightly smaller than the maximum image field height $H'_{max}$ indicate location ranges with a telecentricity error of zero.

In embodiments, low telecentricity errors are achieved through a suitable design of the system aperture stop 11. This will be explained in more detail in the following.

Figure 4:
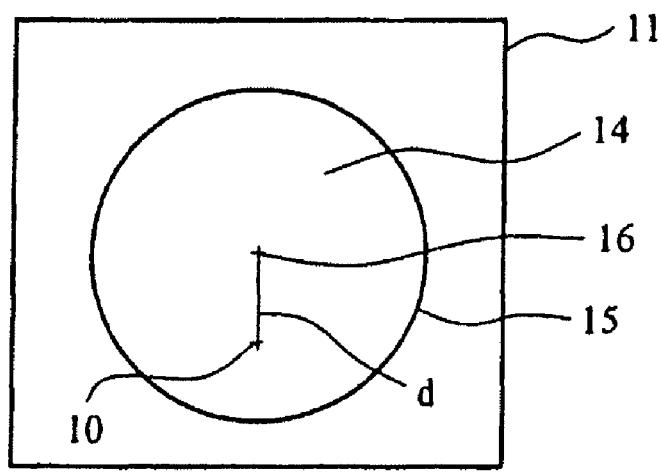
FIG. 4 shows a first example for the geometry of the system aperture stop in a schematic form of representation.

FIG. 4 shows in schematic form a first example for the geometry of the system aperture stop 11. The form of representation has been selected so that the optical axis 10 runs perpendicular to the plane of the drawing, and thus the system aperture stop 11 is shown in a sectional plane that extends orthogonal to the optical axis 10. In this first example, the system aperture stop 11 has an aperture stop opening 14 which is enclosed by an inner aperture stop border 15. The shape of the inner aperture stop border 15 is defined by a circular-shaped border contour curve whose center 16 is located at a distance d from the optical axis 10. To make it possible to vary the size of the aperture stop opening 14, the system aperture stop 11 normally has a plurality of segments, each of which forms a border section of the inner aperture stop border 15. In certain embodiments, such a border section has the shape of a curved line, so that the border contour curve represents a polygon whose sides are curved lines. The border sections are slightly offset against each other in the direction parallel to the optical system axis 10 in order to enable them to be moved relative to each other. Accordingly, due to the way the system aperture stop is constructed, the border contour curve does not lie in a plane in the exact sense of the word. This applies analogously to the further forms of apertures stops whose detailed description follows below, and in the context of the disclosure the respective border contour curves are still considered as planar curves.

Figure 5:
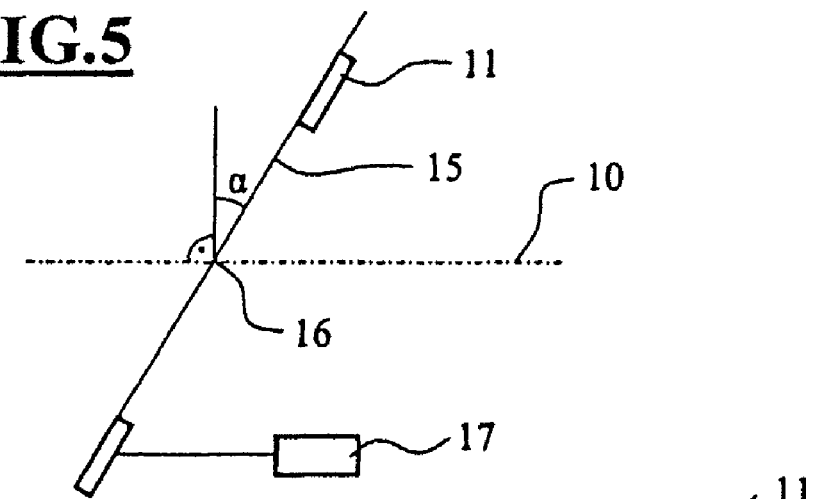
FIG. 5 shows a second example for the geometry of the system aperture stop in a schematic form of representation.

FIG. 5 shows in schematic form a second example for the geometry of the system aperture stop 11. The form of representation is different from FIG. 4, showing a sectional view of the system aperture stop 11 in a section plane parallel to the optical axis 10. The system aperture stop 11 has an aperture stop opening 14 with an inner aperture stop border 15, wherein the border contour curve is of circular shape and has its center point 16 on the optical axis 10. However, the border contour curve is not oriented orthogonally to the optical axis 10, but is set at an angle α larger than 0° to the orthogonal plane. In particular, the angle α conforms to the condition α>2°, such as α>5°.

Also drawn in FIG. 5 is a drive mechanism 17 by which the system aperture stop 11 can be tilted, whereby the angle α can be changed.

Figure 6:
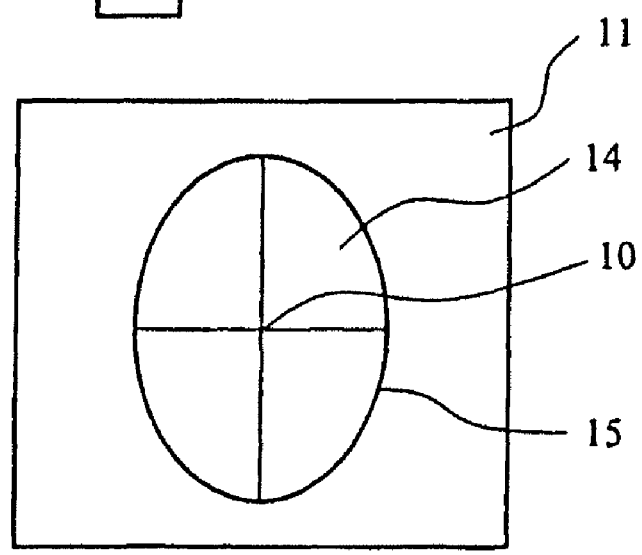
FIG. 6 shows a third example for the geometry of the system aperture stop in a form of representation that is analogous to FIG. 4.

FIG. 6 shows a third example for the geometry of the system aperture stop 11 in a form of representation analogous to FIG. 4. In this third example the border contour curve of the system aperture stop 11 is configured as an ellipse. The point of intersection of the principal axes of the ellipse is located on the optical axis 10. The border contour curve is oriented orthogonal to the optical axis 10. To emulate the shape of an ellipse, the system aperture stop 11 has segments with different curved borders. In some embodiments, all segments of the system aperture stop 11 are configured differently with regard to their borders.

Figure 7:
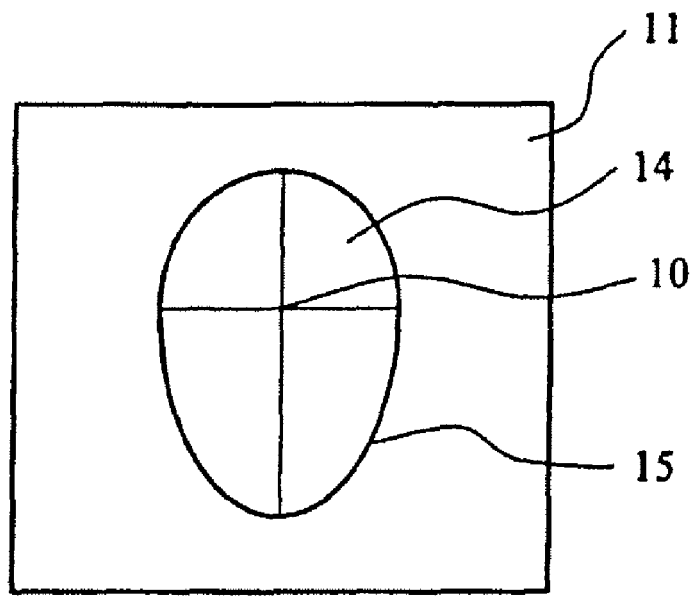
FIG. 7 shows a fourth example for the geometry of the system aperture stop in a form of representation that is analogous to FIG. 4.

FIG. 7 shows a fourth example for the geometry of the system aperture stop 11 in a form of representation analogous to FIG. 4. The border contour curve of the system aperture stop 11 in this fourth example has the shape of an ellipse which has undergone a non-linear distortion. The border contour curve in this example is oriented orthogonally to the optical system axis 10. Prior to the distortion, the intersection of the principal axes of the ellipse is located on the optical axis 10. The fourth example is thus produced by subjecting the border contour curve of the system aperture stop 11 of the third example to a non-linear distortion. What has been said about the segments of the system aperture stop 11 in the third example applies analogously to the fourth example.

The individual features of the examples shown in FIGS. 4 to 7 of embodiments of the system aperture stop 11 can be combined with each other in any way desired. The system aperture stop 11 can for example have an inner aperture stop border 15 with a border contour curve designed in the shape of an ellipse, wherein the intersection of the principal axes of the ellipse is located at a distance d from the optical axis 10 and the ellipse is set at an angle α relative to a plane that is orthogonal to the optical axis. Furthermore, the border contour curve can also have another shape and/or position and/or orientation that results in a low telecentricity error in particular on the image side. The choice of configuration for the system aperture stop 11 is thus considered as a design parameter for optimizing the projection objective 7 in regard to low telecentricity errors.

The embodiments of the system aperture stop 11 represented in FIGS. 4 to 7 relate in each case to the maximum numerical aperture intended for the image side of the projection objective 7, where the aperture stop opening 14 of the system aperture stop 11 has the maximum size intended in the design. In narrowing the aperture, i.e. reducing the size of the aperture stop opening 14, it is envisioned that the system aperture stop 11 is configured as much as possible in such a way that low telecentricity errors can be achieved also in any reduced-aperture condition. To meet this requirement, optimal configurations for the desired reduced-aperture conditions are determined in the preparatory design stage for the system aperture stop 11, and the latter is designed so that it takes on the desired configurations when the aperture stop opening is reduced. In particular in this design phase, a closure movement for the aperture stop opening 14 is established in such a way that not only is the area of the opening made smaller, but that the border contour curve of the inner aperture stop border 15 also varies with regard to its position and/or orientation and/or shape. In some embodiments, when narrowing the aperture stop, the border contour curve of the inner aperture stop border 15 is moved perpendicular to the plane of the border contour curve or also in a direction defined by another angle. A possible sequence of border contour curves during the process of narrowing the system aperture stop is illustrated in FIG. 8.

Figure 8:
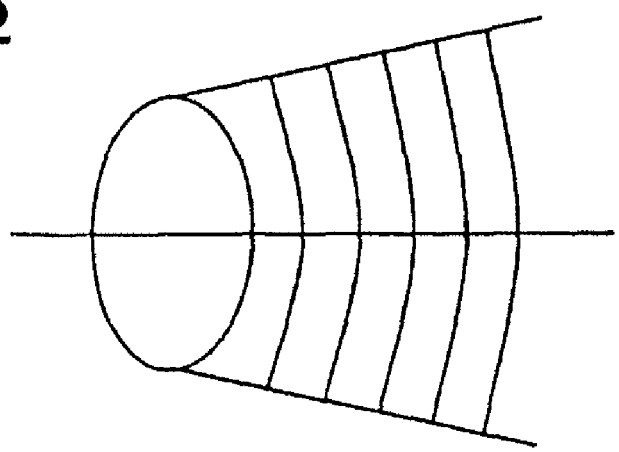
FIG. 8 shows an example for a sequence of border contour curves for different opening states of the system aperture stop in a perspective representation.

FIG. 8 shows an example of a sequence of border contour curves for different opening states of the system aperture stop 11 in a perspective representation. With the sequence illustrated here, a range of values of for example from 1.75 to 1.10 is realized for the image-side numerical aperture. In the different opening states of the system aperture stop 11, the border contour curves enclose different-sized areas and are set in different positions, so that an enveloping surface which contains all of the border contour curves has the shape of a truncated cone. The illustrated sequence of border contour curves can be realized for example by using a system aperture stop 11 having a series of segments which, for each size of the aperture stop opening 14, form a border contour curve according to the truncated cone shown in FIG. 8. To change the position of the border contour curve of the system aperture stop 11, the latter can be tilted by a mechanism similar to the drive mechanism 17 shown in FIG. 5 for the tilting of the system aperture stop 11.

It is likewise possible to realize the sequence of border contour curves shown in FIG. 8 through several aperture stops that are arranged side by side, each of them in a fixed location. The changing of the position of the border contour curve is effected in this case by varying the aperture stop openings of the individual aperture stops. Through this variation it is possible to select which of the aperture stops affects the propagation pattern of the light rays. This accomplishes the same result as changing the position and the size of the border contour curve of the system aperture stop 11.

By using a plurality of aperture stops that are arranged side by side it is also possible to approximate for example the orientation of the border contour curve of the system aperture stop 11 shown in FIG. 5, which is set at an angle α to a plane that is orthogonal to the optical system axis 10.

Figure 9:
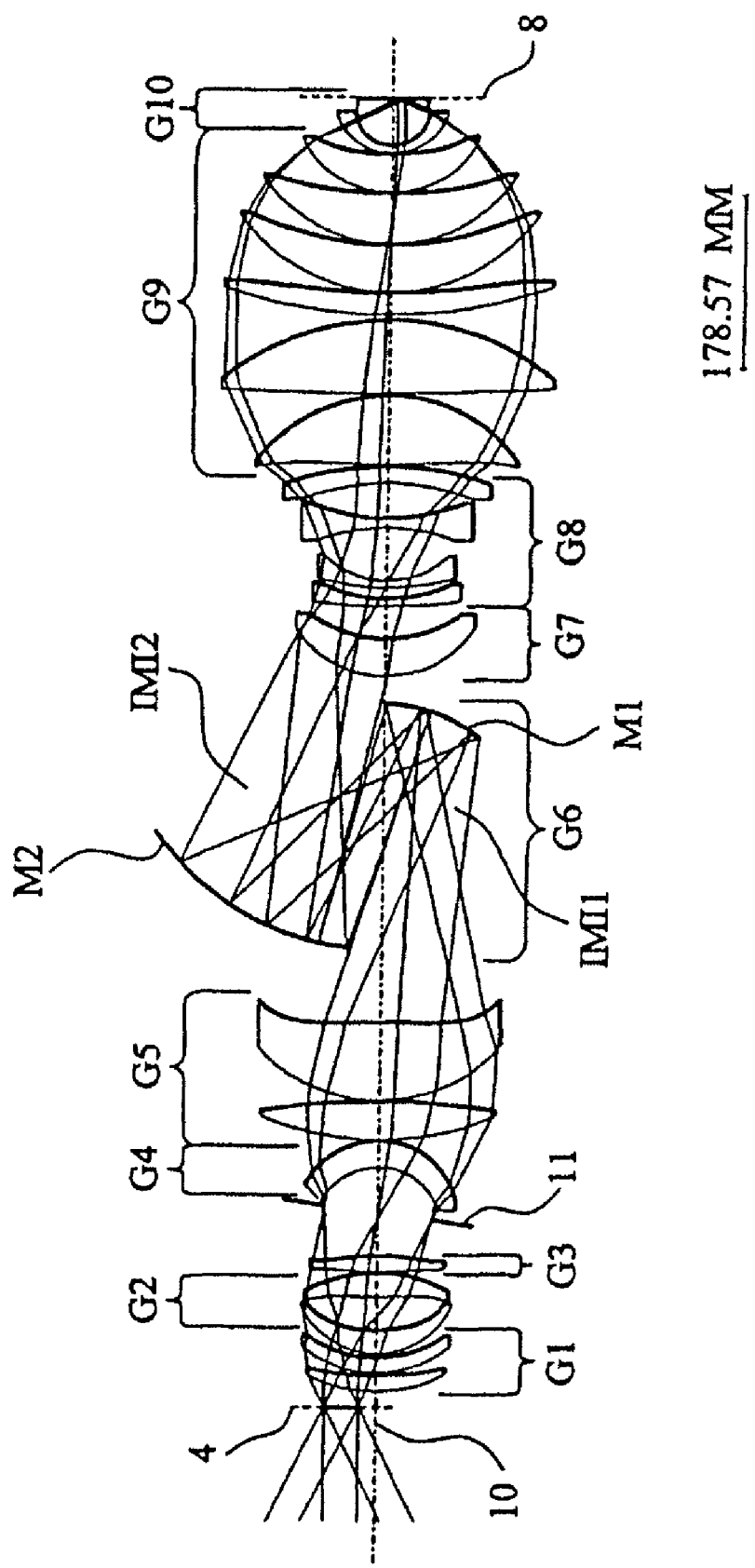
FIG. 9 shows an example of a design for the projection objective in a meridional section.

FIG. 9 shows an example of a design for the projection objective 7 in a meridional section.

The data of the optical surfaces are listed in Tables 1 and 2.

The projection objective 7 is designed for an operating wavelength of 193 nm and has on the image side a numerical aperture of 1.75. The size of the image field 9 is 20 mm×4 mm, with the image field 9 being formed as an off-axis field, i.e. outside of the optical system axis 10. The distance between the object plane 4 and the image plane is 1342.9 mm. The wave front deviation RMS is smaller than 5.2 mλ. The last lens on the image side (surface 46) consists of sapphire (refractive index 1.928). The space between this last lens and the adjacent lens towards the object side (surface 44) is filled with an immersion liquid of refractive index 1.561. Each of the remaining lenses is made of quartz glass (fused silica) with a refractive index of 1.560. As described in detail in U.S. patent application Ser. No. 11/151,465 filed on Jun. 14, 2005 by the same applicant, a lens arrangement of this kind allows very high numerical apertures to be realized on the image side. The full content of U.S. patent application Ser. No. 11/151,465 is hereby incorporated by reference in the present application.

Between the object plane and the system aperture stop 11, a lens group G1, a lens group G2 and a lens group G3 are arranged in the order in which they are named here, with each of the groups containing one or more lenses. The lens groups G1, G2 and G3 contain no lens of negative refractive power. The lens group G1 consists of three positive meniscus lenses, each of which has two aspherical surfaces. The lens group G2 consists of one positive lens with an aspherical surface on the object side and a spherical surface on the image side. Beginning at the object plane 4, the lens groups thus provide five aspherical lens surfaces following each other in immediate succession. With smaller numerical aperture values, it may also be sufficient to use a sequence of four or three aspherical surfaces.

The lens group G3 includes one positive lens which can be designed for a correction of spherical aberrations.

The system aperture stop 11 is followed on the image side by a lens group G4 which consists of one positive meniscus lens with a concave surface on the object side. The lens group G4 is followed on the image side by a lens group G5 which has overall a positive refractive power and can include two aspherical surfaces. The lens group G5 is followed by a first concave mirror M1 and a second concave mirror M2 which together form a mirror group G6. A first intermediate image IM1 which is formed on the object side of the first concave mirror M1 is projected into a second intermediate image IM2 on the image side of the second concave mirror M2.

The second concave mirror M2 is followed on the image side by a lens group G7 which consists of a positive meniscus lens with a concave surface on the image side. This is followed by a lens group G8 with four negative lenses following each other, one of which is configured as a biconcave lens. The two lenses of the lens group G8 which are arranged on the object side of the biconcave lens are curved in the opposite way of the lens on the image side of the biconcave lens.

The lens group G8 is followed on the image side by a lens group G9 with positive lenses. In the area where the ray pattern within the lens group G9 has its largest diameter, a thin meniscus lens of small refractive power is arranged. On the image side, the lens group G9 is followed by the lens group G10 with the last lens on the image side, which is optically coupled on the object side to the neighboring lens of the lens group G10 by using the immersion liquid. The space between the last lens on the image side and the substrate is likewise filled with the immersion liquid.

All of the lenses and mirrors of the catadioptric projection objective 7 shown in FIG. 9 have the respective optical element axes centered on the optical system axis 10.

In embodiments, the configuration of the system aperture stop 11 and the design of the projection objective 7 are matched to each other in such a way that low telecentricity errors are achieved on the object side and/or on the image side. The way in which this is accomplished is described in the following which refers in particular to FIG. 10.

Figure 10:
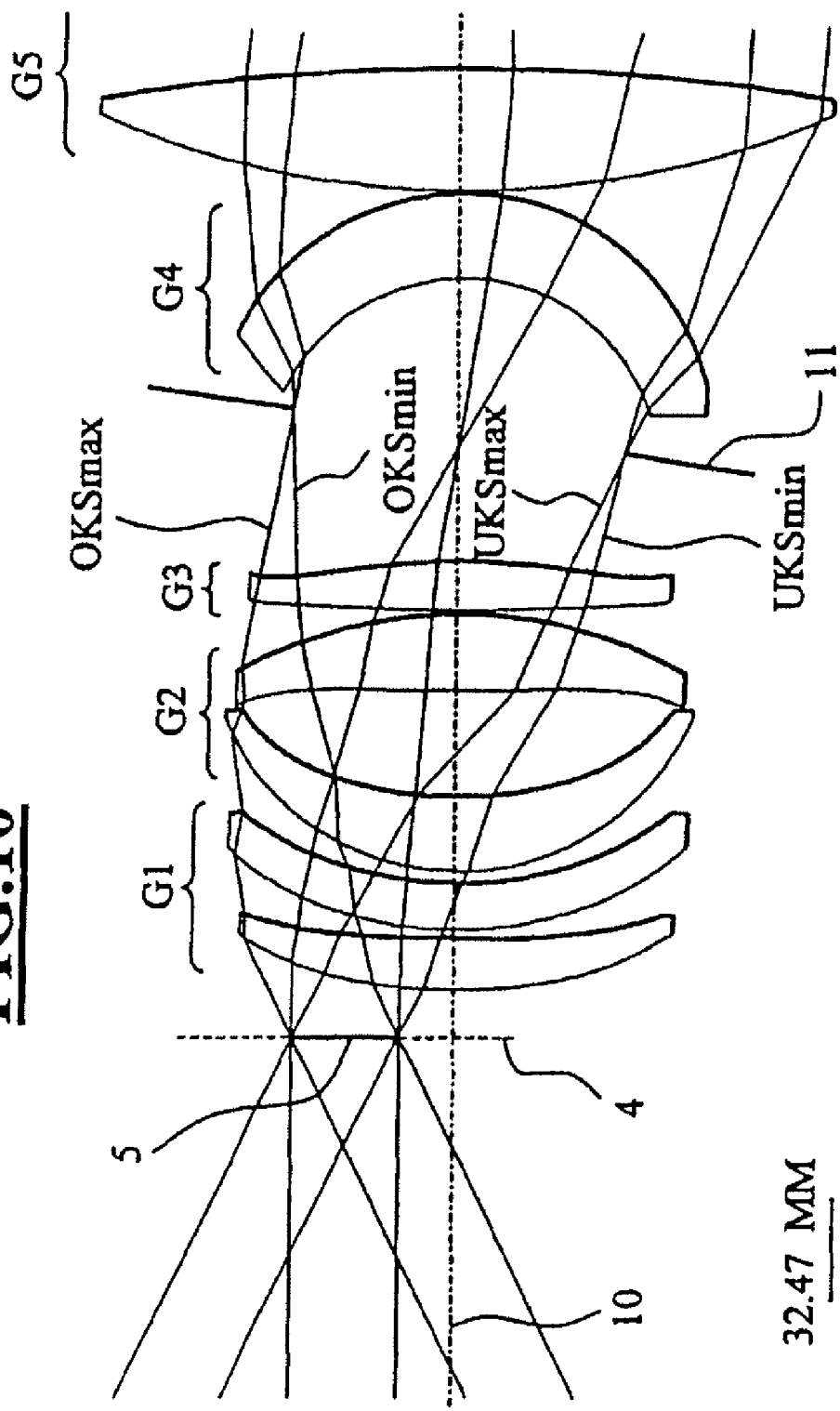
FIG. 10 shows an enlarged detail of FIG. 9 in an area between the object plane and the beginning of the lens group G5.

FIG. 10 shows an enlarged detail of FIG. 9 in an area between the object plane 4 and the beginning of the lens group G5. To achieve low telecentricity errors on the image side which are particularly important for the image quality of the projection objective 7, the following procedure may be used.

As a first step, a design for the objective without system aperture stop 11 is optimized for an intermediate object field height by using a commercially available design program. This is accomplished through calculations of the ray pattern originating from an object point at intermediate object field height. The calculations are made in such a way that the projection of the object point is telecentric on the image side. The calculations are made in particular for a principal ray HS.

Based on the data determined from this calculation for the projection objective 7, ray propagation paths in the opposite direction are calculated, i.e. from the image plane 8 to the object plane 4. A desired aperture is given for each calculation, and the ray paths for two image points are calculated telecentrically. One of the image points has an image field height that is somewhat larger, for example 10% larger, than the minimum image field height $H'_{min}$. The image field height of the other image point is somewhat smaller, for example 10% smaller, than the maximum image field height $H'_{max}$. In accordance with the selected aperture, respective lower coma rays $UKS_{min}$ and $UKS_{max}$ as well as respective upper coma rays $OKS_{min}$ and $OKS_{max}$ are calculated for the two image points. After these rays have been calculated, the border contour curve of the system aperture stop 11 is modified in such a way that the border contour curve runs through the points of intersection of the lower coma rays $UKS_{min}$ and $UKS_{max}$ as well as through the points of intersection of the upper coma rays $OKS_{min}$ and $OKS_{max}$. If the shape of the border contour curve and its tilt angle relative to the optical system axis 10 are known, then the border contour curve is completely defined by the aforementioned two points of intersection. Else, the calculations are made for further rays, whereby accordingly further points of intersection are obtained through which the border contour curve of the system aperture stop 11 passes as a mirror-symmetric closed-loop curve. Normally, the border contour curve will not lie in a plane. Since the deviations from the plane are in most cases of negligible importance, the border contour curve can be projected into a plane.

With the border contour curve of the system aperture stop 11 having been calculated in this way, the calculation is performed anew starting from the object plane 4 in order to improve the correction of the projection objective 7. Next, the border contour curve is again calculated anew, repeating the cycle. In this manner, the design of the projection objective 7, inclusive of the system aperture stop 11, is iteratively optimized. The analogous procedure is also followed with further values for the image-side numerical aperture, with the respective border contour curve of the system aperture stop 11 obtained for each aperture value being stored in memory. If this kind of border contour curve is used, one obtains telecentricity for all of the image points which share the image field height H' that was used in the calculation (illustrated by the circular arcs in FIG. 3). The detailed result of the optimization process in regard to the telecentricity error is represented in FIG. 11.

Figure 11:
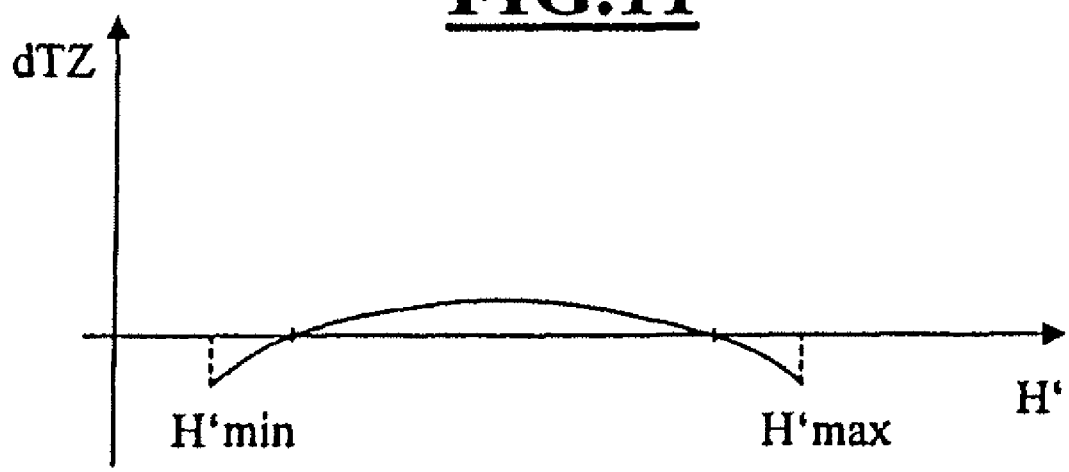
FIG. 11 represents a graph for the telecentricity error dTZ on the image side as a function of the image field height H'.

FIG. 11 represents a schematic graph for the telecentricity error dTZ on the image side as a function of the image field height H'. The telecentricity error vanishes, i.e. dTZ=0, for two image field heights H', one of which is slightly larger than the minimum image field height $H'_{min}$ and the other is slightly smaller than the maximum image field height $H'_{max}$. Although a telecentricity is present, i.e. dTZ≠0, at locations other than these two image field heights H', the telecentricity error over the entire image field 9 is relatively small.

Analogous to the procedure described above, one can also optimize the telecentricity error on the object side. To accomplish this, the respective points of intersection are determined for the upper and lower coma rays OKS and UKS which are calculated starting from object points.

If the image-side telecentricity error is optimized, then the object-side telecentricity error will take on larger values than would be the case with an optimization of the object-side telecentricity error. In particular the distribution of the object-side telecentricity error will not, in general, be rotationally symmetric. The disclosure therefore provides that in case of an image-side optimization the illumination system 2 is adapted to the distribution of the object-side telecentricity error, in particular to the deviations from rotational symmetry. To accomplish this, one can for example provide the illumination system 2 with a rotationally symmetric aperture stop that is arranged in an off-axis and/or tilted position relative to the optical system axis 10. The endeavor is to emulate the distribution of the object-side telecentricity error of the projection objective 7 through the optical elements of the illumination system 2 which are arranged with rotary symmetry relative to the optical system axis 10. To accomplish this, in some embodiments, at least one optical element of the illumination system 2 has at least one aspherical optical surface.

As an alternative to the foregoing concept, the illumination system 2 can also have an off-centered configuration relative to the optical system axis 10. In this case at least one optical surface of the optical elements of the illumination system 2 can be shaped as a free-form surface.

TABLE 1

| Free surface | Radii | Thicknesses | Glass materials | Refractive index at 193.304 nm | ½ Diameter |
|---|---|---|---|---|---|
| 0 | 0.0000000000 | 15.540533865400 |  | 1.00000000 | 52.000 |
| 1 | 194.0843526480AS | 16.662244154000 | SIO2 | 1.56028895 | 67.535 |
| 2 | 601.0259250050AS | 2.872194067190 |  | 1.00000000 | 67.696 |

TABLE 1-continued

| Free surface | Radii | Thicknesses | Glass materials | Refractive index at 193.304 nm | ½ Diameter |
|---|---|---|---|---|---|
| 3 | 123.5214102280AS | 15.000000000000 | SIO2 | 1.56028895 | 71.585 |
| 4 | 121.9737217420AS | 3.820438223060 | | 1.00000000 | 69.254 |
| 5 | 82.8634482361AS | 24.232922315400 | SIO2 | 1.56028895 | 73.147 |
| 6 | 138.2008074220AS | 33.915581258400 | | 1.00000000 | 69.610 |
| 7 | 700.0849013230AS | 24.705151418600 | SIO2 | 1.56028895 | 69.271 |
| 8 | −150.2957460870 | 1.314663969280 | | 1.00000000 | 69.987 |
| 9 | 592.6142488190AS | 15.879457781800 | SIO2 | 1.56028895 | 65.589 |
| 10 | −195.1054913650AS | 31.039821568900 | | 1.00000000 | 64.147 |
| 11 | 0.0000000000 | 60.200321556900 | | 1.00000000 | 53.425 |
| 12 | −63.8128752946 | 27.671864382400 | SIO2 | 1.56028895 | 60.120 |
| 13 | −81.5428033685 | 0.700062275896 | | 1.00000000 | 76.397 |
| 14 | 300.7085804080AS | 40.135453240900 | SIO2 | 1.56028895 | 114.866 |
| 15 | −700.0095004160 | 0.700000000000 | | 1.00000000 | 115.604 |
| 16 | 171.3504677990AS | 80.374832252200 | SIO2 | 1.56028895 | 119.323 |
| 17 | −942.4285942720AS | 72.682604803700 | | 1.00000000 | 106.383 |
| 18 | 261.2003479270 | 255.615632188000 | | 1.00000000 | 90.032 |
| 19 REFL | −145.9670291570AS | −255.615632188000 | | −1.00000000 | 96.711 |
| 20 REFL | 261.2003479270AS | 255.615632188000 | | 1.00000000 | 205.500 |
| 21 | 0.0000000000 | 28.202697505800 | | 1.00000000 | 124.157 |
| 22 | 107.9475264040AS | 39.128202658600 | SIO2 | 1.56028895 | 87.525 |
| 23 | 129.6464261700 | 33.335663966100 | | 1.00000000 | 76.481 |
| 24 | 772.7738751790AS | 7.540850065670 | SIO2 | 1.56028895 | 72.105 |
| 25 | 148.3600842010 | 10.752313133300 | | 1.00000000 | 66.826 |
| 26 | 211.8538554550AS | 7.500000000000 | SIO2 | 1.56028895 | 66.312 |
| 27 | 91.0724991036AS | 53.472564908300 | | 1.00000000 | 62.659 |
| 28 | −209.9468742450AS | 9.541939835450 | SIO2 | 1.56028895 | 68.114 |
| 29 | 181.8846712900AS | 36.692666840900 | | 1.00000000 | 83.768 |
| 30 | −219.2748825560AS | 17.027712868800 | SIO2 | 1.56028895 | 88.237 |
| 31 | −309.2842453530 | 2.219172978980 | | 1.00000000 | 101.864 |
| 32 | 1030.3038274100AS | 70.193095189100 | SIO2 | 1.56028895 | 124.863 |
| 33 | −164.3740822690 | 1.788132337470 | | 1.00000000 | 130.139 |
| 34 | 2886.8907874300AS | 74.877620180800 | SIO2 | 1.56028895 | 162.455 |
| 35 | −265.5364552450 | 5.778407295170 | | 1.00000000 | 165.733 |
| 36 | 507.7799704340 | 22.709794173400 | SIO2 | 1.56028895 | 164.030 |
| 37 | 606.3207747650AS | 0.700039396941 | | 1.00000000 | 163.034 |
| 38 | 186.3571791410 | 48.273119503100 | SIO2 | 1.56028895 | 148.717 |
| 39 | 305.5638355100AS | 0.700000000000 | | 1.00000000 | 144.634 |
| 40 | 154.5503100380 | 52.713097797500 | SIO2 | 1.56028895 | 125.389 |
| 41 | 482.6761569020AS | 0.700020540427 | | 1.00000000 | 119.144 |
| 42 | 109.0385331960AS | 39.086233666400 | SIO2 | 1.56028895 | 86.739 |
| 43 | 257.8426865140AS | 0.700000000000 | | 1.00000000 | 78.379 |
| 44 | 58.5779739783AS | 8.092684630850 | SIO2 | 1.56028895 | 54.042 |
| 45 | 37.0000000000 | 0.200000000000 | IMM | 1.56100000 | 36.999 |
| 46 | 35.6438433877 | 47.933800660600 | SAPHIR | 1.92803200 | 35.644 |
| 47 | 0.0000000000 | 0.000000000000 | | 1.00000000 | 13.000 |

TABLE 2

(Aspherical Constants)

Surface No. 1

| K | 0.000000000000 |
|---|---|
| C1 | 1.53580060189e−007 |
| C2 | 4.37147009238e−011 |
| C3 | −1.44280450701e−014 |
| C4 | 2.30939511997e−018 |
| C5 | −1.41126113836e−022 |
| C6 | −2.86994293828e−027 |
| C7 | −4.66030590963e−032 |
| C8 | 0.00000000000e+000 |
| C9 | 0.00000000000e+000 |

Surface No. 2

| K | 0.000000000000 |
|---|---|
| C1 | 2.05475030318e−007 |
| C2 | 3.43306267463e−012 |
| C3 | −6.03754820065e−015 |
| C4 | 8.12048395817e−019 |
| C5 | 6.85198982707e−023 |
| C6 | −1.76800633561e−026 |

TABLE 2-continued (Aspherical Constants)

| C7 | −1.54715790184e−031 |
|---|---|
| C8 | 0.00000000000e+000 |
| C9 | 0.00000000000e+000 |

Surface No. 3

| K | 0.000000000000 |
|---|---|
| C1 | 2.80505395333e−008 |
| C2 | 1.18214929857e−012 |
| C3 | 4.43975659299e−016 |
| C4 | −8.96913965171e−021 |
| C5 | 2.28059226043e−024 |
| C6 | 2.18132760611e−027 |
| C7 | −6.33654716670e−032 |
| C8 | 0.00000000000e+000 |
| C9 | 0.00000000000e+000 |

Surface No. 4

| K | 0.000000000000 |
|---|---|
| C1 | 7.30144882022e−009 |
| C2 | 3.99027534785e−012 |
| C3 | 1.26444872856e−015 |

TABLE 2-continued (Aspherical Constants)

| | | |
|---|---|---|
| C4 | −1.55197142650e−019 | |
| C5 | −1.81792687277e−023 | |
| C6 | −7.63125303967e−028 | |
| C7 | 9.51733999190e−031 | |
| C8 | 0.00000000000e+000 | |
| C9 | 0.00000000000e+000 | |

Surface No. 5

| | |
|---|---|
| K | 0.000000000000 |
| C1 | 1.78428206569e−008 |
| C2 | −1.78267013712e−011 |
| C3 | 3.11468111141e−015 |
| C4 | −1.42413355329e−019 |
| C5 | −7.60527907992e−024 |
| C6 | 4.52567685944e−027 |
| C7 | −1.70176213023e−031 |
| C8 | 0.00000000000e+000 |
| C9 | 0.00000000000e+000 |

Surface No. 6

| | |
|---|---|
| K | 0.000000000000 |
| C1 | 1.57398144145e−007 |
| C2 | 2.41033159710e−011 |
| C3 | −1.89535935563e−016 |
| C4 | 5.43277241223e−019 |
| C5 | 3.09155758192e−023 |
| C6 | 5.08641360901e−027 |
| C7 | −4.15917082370e−031 |
| C8 | 0.00000000000e+000 |
| C9 | 0.00000000000e+000 |

Surface No. 7

| | |
|---|---|
| K | 0.000000000000 |
| C1 | −8.28363131657e−008 |
| C2 | −1.09857575404e−010 |
| C3 | 2.28465656413e−014 |
| C4 | −2.58470131840e−018 |
| C5 | 1.47347540447e−022 |
| C6 | −5.78024497285e−027 |
| C7 | −5.12701081832e−032 |
| C8 | 0.00000000000e+000 |
| C9 | 0.00000000000e+000 |

Surface No. 9

| | |
|---|---|
| K | 0.000000000000 |
| C1 | −1.50367287432e−007 |
| C2 | 4.33566143657e−011 |
| C3 | −3.28489831552e−015 |
| C4 | 2.43576337282e−019 |
| C5 | −7.82659887414e−022 |
| C6 | 1.43549715624e−025 |
| C7 | 9.29463353921e−031 |
| C8 | 0.00000000000e+000 |
| C9 | 0.00000000000e+000 |

Surface No. 10

| | |
|---|---|
| K | 0.000000000000 |
| C1 | 1.71360763151e−007 |
| C2 | 3.40304537757e−011 |
| C3 | 1.07458067356e−015 |
| C4 | 3.36561640462e−019 |
| C5 | −5.32852404410e−022 |
| C6 | 1.09544893681e−025 |
| C7 | 5.65456706017e−031 |
| C8 | 0.00000000000e+000 |
| C9 | 0.00000000000e+000 |

Surface No. 14

| | |
|---|---|
| K | 0.000000000000 |
| C1 | −1.03665637043e−008 |
| C2 | 8.44490682886e−013 |
| C3 | 2.46109863345e−017 |
| C4 | −1.65646746620e−021 |
| C5 | −2.69536312917e−026 |
| C6 | 2.62714238492e−030 |
| C7 | −4.20655605345e−035 |
| C8 | 0.00000000000e+000 |
| C9 | 0.00000000000e+000 |

TABLE 2-continued (Aspherical Constants)

Surface No. 16

| | |
|---|---|
| K | 0.000000000000 |
| C1 | 3.27772940205e−009 |
| C2 | 8.58298900267e−013 |
| C3 | −2.15829968915e−017 |
| C4 | 1.67683454251e−021 |
| C5 | −6.29875870315e−028 |
| C6 | −8.62577589102e−031 |
| C7 | 5.94130959623e−035 |
| C8 | 0.00000000000e+000 |
| C9 | 0.00000000000e+000 |

Surface No. 17

| | |
|---|---|
| K | 0.000000000000 |
| C1 | 1.10798311041e−007 |
| C2 | 6.38121944996e−013 |
| C3 | 4.18439528403e−017 |
| C4 | 3.21195049754e−021 |
| C5 | −1.46315306717e−025 |
| C6 | 9.59423392136e−030 |
| C7 | −9.99943858147e−035 |
| C8 | 0.00000000000e+000 |
| C9 | 0.00000000000e+000 |

Surface No. 19

| | |
|---|---|
| K | −0.126018684288 |
| C1 | 1.57652967374e−008 |
| C2 | 5.27495947385e−013 |
| C3 | 3.90625951134e−018 |
| C4 | 1.57378853311e−021 |
| C5 | −7.63251270922e−026 |
| C6 | 3.77738608925e−030 |
| C7 | −1.82837845494e−035 |
| C8 | 0.00000000000e+000 |
| C9 | 0.00000000000e+000 |

Surface No. 20

| | |
|---|---|
| K | −0.335030627870 |
| C1 | 4.19216946302e−010 |
| C2 | 5.16763519390e−015 |
| C3 | 3.81551354811e−020 |
| C4 | 8.49241054125e−025 |
| C5 | −4.62340406354e−030 |
| C6 | 1.13567152568e−034 |
| C7 | 5.85698996538e−040 |
| C8 | 0.00000000000e+000 |
| C9 | 0.00000000000e+000 |

Surface No. 22

| | |
|---|---|
| K | 0.000000000000 |
| C1 | 2.40044420984e−009 |
| C2 | 2.62877373276e−013 |
| C3 | −1.72117249870e−017 |
| C4 | 3.95556416639e−021 |
| C5 | 1.94699943644e−026 |
| C6 | −1.15779075296e−029 |
| C7 | 2.69591509840e−033 |
| C8 | 0.00000000000e+000 |
| C9 | 0.00000000000e+000 |

Surface No. 24

| | |
|---|---|
| K | 0.000000000000 |
| C1 | 3.37596447524e−008 |
| C2 | 1.70502456778e−012 |
| C3 | −8.61065120631e−016 |
| C4 | 3.32077287269e−019 |
| C5 | −3.60401802891e−023 |
| C6 | 1.56935590554e−027 |
| C7 | 1.05773251662e−032 |
| C8 | 0.00000000000e+000 |
| C9 | 0.00000000000e+000 |

Surface No. 26

| | |
|---|---|
| K | 0.000000000000 |
| C1 | −9.29111107548e−008 |
| C2 | 1.68276571180e−011 |
| C3 | −3.63694977186e−015 |

TABLE 2-continued (Aspherical Constants)

| | | |
|---|---|---|
| C4 | −1.23220378388e−018 | |
| C5 | 2.41221442164e−022 | |
| C6 | −9.41073263080e−027 | |
| C7 | −3.03503780724e−031 | |
| C8 | 0.00000000000e+000 | |
| C9 | 0.00000000000e+000 | |
| Surface No. 27 | | |
| K | 0.000000000000 | |
| C1 | 3.81208866891e−009 | |
| C2 | 2.72991732366e−011 | |
| C3 | −2.97254179684e−015 | |
| C4 | −1.26524448732e−018 | |
| C5 | 8.77441249602e−023 | |
| C6 | 1.83517040884e−026 | |
| C7 | −8.18434929700e−031 | |
| C8 | 0.00000000000e+000 | |
| C9 | 0.00000000000e+000 | |
| Surface No. 28 | | |
| K | 0.000000000000 | |
| C1 | 1.87329226354e−008 | |
| C2 | −1.24778327791e−011 | |
| C3 | −3.30870775926e−015 | |
| C4 | 6.71458248780e−019 | |
| C5 | −7.29629717597e−023 | |
| C6 | 3.16988730069e−027 | |
| C7 | 2.46939919655e−031 | |
| C8 | 0.00000000000e+000 | |
| C9 | 0.00000000000e+000 | |
| Surface No. 29 | | |
| K | 0.000000000000 | |
| C1 | 2.58315707724e−008 | |
| C2 | −1.00466730469e−011 | |
| C3 | −4.54399008104e−015 | |
| C4 | 1.08602340866e−018 | |
| C5 | −1.02126065129e−022 | |
| C6 | 3.89155942770e−027 | |
| C7 | −7.01208542089e−033 | |
| C8 | 0.00000000000e+000 | |
| C9 | 0.00000000000e+000 | |
| Surface No. 30 | | |
| K | 0.000000000000 | |
| C1 | −2.63523261865e−008 | |
| C2 | 5.23147174454e−012 | |
| C3 | 1.69172618882e−016 | |
| C4 | 2.60135285724e−021 | |
| C5 | −1.51918903097e−025 | |
| C6 | 7.19389831314e−029 | |
| C7 | 8.18261158623e−034 | |
| C8 | 0.00000000000e+000 | |
| C9 | 0.00000000000e+000 | |
| Surface No. 32 | | |
| K | 0.000000000000 | |
| C1 | −3.84342823780e−008 | |
| C2 | 3.58003148936e−013 | |
| C3 | −1.40995797614e−017 | |
| C4 | −7.92220283833e−023 | |
| C5 | 2.47196924680e−026 | |
| C6 | −1.56205546365e−030 | |
| C7 | 6.66608457485e−036 | |
| C8 | 0.00000000000e+000 | |
| C9 | 0.00000000000e+000 | |
| Surface No. 34 | | |
| K | 0.000000000000 | |
| C1 | −6.51388016127e−010 | |
| C2 | −1.43287679072e−014 | |
| C3 | −1.27434225846e−019 | |
| C4 | −1.59081855277e−024 | |
| C5 | 2.02035646368e−027 | |
| C6 | −4.32115573131e−032 | |
| C7 | 8.45637496695e−038 | |
| C8 | 0.00000000000e+000 | |
| C9 | 0.00000000000e+000 | |

TABLE 2-continued (Aspherical Constants)

| | | |
|---|---|---|
| Surface No. 37 | | |
| K | 0.000000000000 | |
| C1 | −1.08686254761e−008 | |
| C2 | 7.32840821265e−014 | |
| C3 | −7.80315949413e−018 | |
| C4 | −2.80079637700e−022 | |
| C5 | 1.42091408179e−026 | |
| C6 | −1.53671405032e−031 | |
| C7 | 1.05238268277e−037 | |
| C8 | 0.00000000000e+000 | |
| C9 | 0.00000000000e+000 | |
| Surface No. 39 | | |
| K | 0.000000000000 | |
| C1 | −2.75747291486e−009 | |
| C2 | −2.04476838140e−013 | |
| C3 | −1.52183286713e−018 | |
| C4 | −8.84487351136e−023 | |
| C5 | 5.24742783613e−027 | |
| C6 | 9.84775438206e−032 | |
| C7 | −1.60784102687e−037 | |
| C8 | 0.00000000000e+000 | |
| C9 | 0.00000000000e+000 | |
| Surface No. 41 | | |
| K | 0.000000000000 | |
| C1 | 7.82982330319e−009 | |
| C2 | 1.38750383984e−013 | |
| C3 | 9.98653358219e−017 | |
| C4 | −6.37822116004e−021 | |
| C5 | 2.67109254943e−025 | |
| C6 | −4.11841497399e−030 | |
| C7 | −5.87213510935e−036 | |
| C8 | 0.00000000000e+000 | |
| C9 | 0.00000000000e+000 | |
| Surface No. 42 | | |
| K | 0.000000000000 | |
| C1 | 7.26053648841e−008 | |
| C2 | 3.43982570495e−013 | |
| C3 | 4.14194855805e−016 | |
| C4 | 4.26938202919e−022 | |
| C5 | 1.20386450966e−024 | |
| C6 | 2.97083357375e−028 | |
| C7 | 2.34728864817e−033 | |
| C8 | 0.00000000000e+000 | |
| C9 | 0.00000000000e+000 | |
| Surface No. 43 | | |
| K | 0.000000000000 | |
| C1 | 1.25024563086e−007 | |
| C2 | 1.56997202669e−012 | |
| C3 | 4.72646788286e−016 | |
| C4 | −1.47442225688e−020 | |
| C5 | −1.90175829913e−024 | |
| C6 | −2.08981842563e−028 | |
| C7 | 2.38677580928e−033 | |
| C8 | 0.00000000000e+000 | |
| C9 | 0.00000000000e+000 | |
| Surface No. 44 | | |
| K | 0.000000000000 | |
| C1 | −1.16394076889e−007 | |
| C2 | −1.98220643258e−011 | |
| C3 | −3.14856922490e−015 | |
| C4 | −9.14862325536e−019 | |
| C5 | 2.42498375714e−022 | |
| C6 | −4.21130938488e−026 | |
| C7 | 4.67617250312e−030 | |
| C8 | 0.00000000000e+000 | |
| C9 | 0.00000000000e+000 | |

What is claimed is:

1. An apparatus, comprising:
a plurality of optical elements; and a system aperture stop having an inner aperture stop border defining an aperture stop opening having a shape that emulates a nonlinear stretched ellipse, wherein:

the apparatus is configured so that during operation the apparatus projects an image of an object field in an object plane onto an image field in an image plane; and the apparatus is a projection objective configured to be used in a microlithography exposure apparatus.

2. The apparatus of claim 1, wherein the plurality of optical elements is arranged along an optical system axis.

3. The apparatus of claim 2, wherein a centroid of the image field is arranged at a lateral distance from the optical system axis.

4. The apparatus of claim 2, wherein a projection of the inner aperture stop border onto a plane orthogonal to the optical system axis is off-centered from the optical system axis.

5. An apparatus, comprising:

a plurality of optical elements; and a system aperture stop having an inner aperture stop border defining an aperture stop opening whose shape is defined by a border contour curve, the border contour curve being an irregular polygon in which at least one corner deviates from a circular line which envelops the polygon on the outside, wherein:

the apparatus is configured so that during operation the apparatus projects an image of an object field in an object plane onto an image field in an image plane;

the system aperture stop has only one axis of symmetry; and the apparatus is a projection objective configured to be used in a microlithography exposure apparatus.

6. The apparatus of claim 5, wherein the plurality of optical elements is arranged along an optical system axis.

7. The apparatus of claim 6, wherein a centroid of the image field is arranged at a lateral distance from the optical system axis.

8. The apparatus of claim 6, wherein a projection of the inner aperture stop border onto a plane orthogonal to the optical system axis is off-centered from the optical system axis.

9. The apparatus of claim 5, wherein the sides of the polygon are configured as curved lines.

10. The apparatus of claim 5, wherein the shape of the polygon emulates a nonlinear stretched ellipse.

11. The apparatus of claim 5, wherein the border contour curve is configured as a planar curve.

* * * * *

UNITED STATES PATENT AND TRADEMARK OFFICE
CERTIFICATE OF CORRECTION

PATENT NO. : 8,049,973 B2  
APPLICATION NO. : 12/776047  
DATED : November 1, 2011  
INVENTOR(S) : Karl-Heinz Schuster Page 1 of 1

It is certified that error appears in the above-identified patent and that said Letters Patent is hereby corrected as shown below:

Title page, Column 2, Item (57) Abstract, Line 8, delete "axis)." and insert --axis.--

Column 5, Line 2, delete "objective," and insert --objective;--

Signed and Sealed this  
Twenty-seventh Day of December, 2011

David J. Kappos  
*Director of the United States Patent and Trademark Office*